(12) United States Patent
Golden et al.

(10) Patent No.: US 7,952,428 B2
(45) Date of Patent: May 31, 2011

(54) DYNAMICALLY ADJUSTABLE LOW NOISE, LOW POWER INSTRUMENTATION AMPLIFIER

(75) Inventors: Philip V. Golden, Menlo Park, CA (US); Marc T. Thompson, Harvard, MA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/719,792

(22) Filed: Mar. 8, 2010

(65) Prior Publication Data

US 2011/0043281 A1 Feb. 24, 2011

Related U.S. Application Data

(63) Continuation-in-part of application No. 12/627,959, filed on Nov. 30, 2009, now Pat. No. 7,880,541.

(60) Provisional application No. 61/234,962, filed on Aug. 18, 2009, provisional application No. 61/250,992, filed on Oct. 13, 2009.

(51) Int. Cl.
*H03F 3/45* (2006.01)
(52) U.S. Cl. ...................... 330/69; 330/124 R
(58) Field of Classification Search .............. 330/69, 330/124 R, 9, 295, 310, 150, 98, 252
See application file for complete search history.

(56) References Cited

U.S. PATENT DOCUMENTS

| | | | |
|---|---|---|---|
| 6,515,542 B1 * | 2/2003 | Wang et al. | 330/69 |
| 7,253,680 B2 * | 8/2007 | Laletin | 330/69 |
| 7,292,095 B2 * | 11/2007 | Burt et al. | 330/9 |

OTHER PUBLICATIONS

"Intstrumentation Amplifier," http://en.wikipedia.org/wiki/Instrumentation_amplifier, 2 pages, accessed Nov. 25, 2009.
"High Common-Mode Voltage, Programmable Gain Difference Amplifier," Analog Devices, Inc., AD628, 20 pages, 2002-2007.
"Single, Dual, and Quad Micropower, Zero-Drift, RRIO Operational Amplifiers," Intersil Americas Inc., Intersil Data Sheet FN6560.1, May 29, 2009.
"3 Op Amp Instrumentation Amplifier," http://www.ecircuitcenter.com/Circuits/instamp1/instamp1.htm, eCircuit Center, 2002.

* cited by examiner

*Primary Examiner* — Henry K Choe
(74) *Attorney, Agent, or Firm* — Fliesler Meyer LLP

(57) ABSTRACT

A circuit in accordance with an embodiment of the present invention includes an instrumentation amplifier, a dynamically adjustable low pass filter, at least one monitor and a controller. The instrumentation amplifier includes a pair of buffered operational amplifiers that accept a pair of input signals, and a differential operational amplifier that outputs an output signal indicative of a difference between the pair of input signals. The dynamically adjustable low pass filter is configured to provide band limiting of the output signal at frequencies greater than a cutoff frequency. The monitor, or monitors, is/are configured to monitor a signal upstream of the instrumentation amplifier and/or a signal downstream of the instrumentation amplifier and output a monitor signal. The controller is configured to receive the monitor signal, or signals, and to dynamically adjust output voltage noise at frequencies greater than the crossover frequency of the multipath amplifiers and/or the cutoff frequency of the low pass filter based on the monitor signal, or signals.

19 Claims, 10 Drawing Sheets

DYNAMICALLY ADJUSTABLE LOW NOISE, LOW POWER INSTRUMENTATION AMPLIFIER

PRIORITY CLAIM

The present application is a continuation-in-part (CIP) of U.S. patent application Ser. No. 12/627,959, filed Nov. 30, 2009, which claims priority under 35 U.S.C. 119(e) to U.S. Provisional Patent Application No. 61/234,962, entitled "Low Noise, Low Power Instrumentation Amplifier", filed Aug. 18, 2009 and U.S. Provisional Patent Application No. 61/250,992, entitled "Low Noise, Low Power Instrumentation Amplifier", filed Oct. 13, 2009. Priority is claimed to each of the above applications, each of which is incorporated herein by reference.

FIELD OF INVENTION

The present invention relates to amplifiers, methods for use therewith, and circuits that include amplifiers.

BACKGROUND

FIG. 1 illustrates a conventional instrumentation amplifier 102 that includes buffered operational amplifiers OP1 and OP2 (also referred to as input buffers), and a differential operational amplifier OP3. The input buffers OP1 and OP2 provide a high input impedance, and eliminate the need for input impedance matching, thereby making the instrumentation amplifier 102 very useful for measurement and test equipment. For example, the instrumentation amplifier 102 is very useful for measuring the output of a sensor, such as, but not limited to, a strain gauge, photo detector, thermistor, thermocouple, temperature sensor, level sensor, current sensor, biometric sensor and Hall effect sensor. More generally, an instrumentation amplifier is useful for amplifying a relatively small differential signal that is superimposed on a relatively large common mode signal (e.g., a DC signal). This is because an instrumentation amplifier amplifies the difference between its two inputs (V1 and V2) while rejecting the signal that is common to the two inputs, to thereby produce its output (Vout). In FIG. 1 (and some of the other FIGS.) the instrumentation amplifier accepts a pair of input signals. Where the pair of input signals are a pair of complementary signals used for differential signaling, the pair of input signals may also be referred to collectively as an input signal.

Each operational amplifier of the instrumentation amplifier 102 can be implemented as a multi-path amplifier (sometimes referred to as a "feed-forward" amplifier), that includes separate low and high frequency feed-forward paths. Exemplary multi-path amplifiers 212B and 212C are shown in FIGS. 2B and 2C, respectively. Referring first to FIG. 2A, the multi-path amplifier 212A is generally shown as having a low frequency path including at least transconductance stages Gms, Gmi and Gmout, and a high frequency path including transconductance stage Gmf. Each transconductor stage (e.g., Gms, Gmi, Gmout and Gmf) can also be referred to simply as a transconductor. The capacitors Ccs and Ccf provide for parallel integration paths for low and high frequency.

Each of the transconductance stages in FIG. 2 is assumed to have a very high (but finite) output impedance. The unity gain frequency for the low frequency path is proportional to Gms/Ccs. The unity gain frequency for the high frequency path is proportional to Gmf/Ccf. Setting Gms/Ccs=Gmf/Ccf allows for a clean 20 dB/decade roll-off for the overall open loop transfer, which is a very desirable characteristic for the amplifier. FIG. 2B illustrates a specific implementation of a multi-path amplifier 212B. The multi-path amplifier 212B can be referred to as "3-stage multi-path" amplifier, because there are three transconductance stages in the low frequency path, and there are multiple paths between the input and output of the amplifier 212B. FIG. 2C illustrates an exemplary 4-stage multi-path amplifier 212C. Depending on implementation, additional transconductance stages can be added, as can choppers, filters, etc.

In multi-path amplifiers, such as those in FIGS. 2A, 2B and 2C (but not limited thereto), the transconductances Gms and Gmf (of the differential input transconductance stages of the low and high frequency paths) are conventionally set such that they are equal in order to give a flat voltage noise response over frequency up to the bandwidth of the amplifier. Here it is assumed that the low frequency (e.g. 1/f) noise is negligible, this can be achieved using circuit techniques such as chopping. Stated another way, Gms=Gmf. Further, the capacitors Ccs and Ccf are conventionally set such that they are equal, i.e., Ccs=Ccf. This also results in Gms/Ccs=Gmf/Ccf.

FIG. 3 illustrates the flat noise spectral density response of a conventional instrumentation amplifier (e.g., 102 in FIG. 1) that is implemented using multi-path amplifiers (e.g., 212A, 212B or 212C in FIGS. 2A, 2B and 2C) having the conventional transconductance and capacitor values just described above. Here it is assumed that the low frequency (e.g. 1/f) noise is negligible, which can be achieved using circuit techniques such as chopping. Additionally, an infinite bandwidth is assumed, and only the ideal white noise profile of the amplifier is represented.

While the flat frequency response shown in FIG. 3 is sometimes desirable, other responses may be acceptable or desirable, depending on the application. Further, depending on the application and/or the larger circuit in which an instrumentation amplifier is incorporated, it may be desirable to reduce the current and power drawn by an instrumentation amplifier. For example, where an instrumentation amplifier is incorporated into a portable device that draws current and power from a battery, it would be beneficial to reduce the current and power drawn from the battery, to thereby increase the time between battery charges or replacement.

SUMMARY

A circuit in accordance with an embodiment of the present invention includes an instrumentation amplifier, a dynamically adjustable low pass filter, at least one monitor and a controller. The instrumentation amplifier includes a pair of buffered operational amplifiers that accept a pair of input signals, and a differential operational amplifier that outputs an output signal indicative of a difference between the pair of input signals. The dynamically adjustable low pass filter is configured to provide band limiting of the output signal at frequencies greater than a cutoff frequency. The monitor, or monitors, is/are configured to monitor a signal upstream of the instrumentation amplifier and/or a signal downstream of the instrumentation amplifier and output one or more monitor signals. Each of the buffered operational amplifiers and the differential operational amplifier are implemented as a multi-path amplifier that includes a low frequency path and a high frequency path between an input and an output of the operational amplifier. Further, each of the multi-path amplifiers includes a differential input transconductance stage within the low frequency path and a differential input transconductance stage within the high frequency path. Within each of the multi-path amplifiers, the differential input transconductance stage of the high frequency path is configured to provide dynamically adjustable noise shaping by producing more noise but consuming less power than the differential input transconductance stage of the low frequency path above a crossover frequency. The controller is configured to receive the monitor signal, or signals. The controller is further configured to dynamically adjust output voltage noise at frequencies greater than the crossover frequency of the multipath amplifiers and/or the cutoff frequency of the low pass filter based on the monitor signal, or signals.

In accordance with an embodiment, the controller is further configured to dynamically adjust output voltage noise at frequencies greater than the crossover frequency of the multipath amplifiers and/or the cutoff frequency of the low pass filter based on the monitor signal, or signals, to reduce power consumption of the instrumentation amplifier.

In accordance with an embodiment, noise shaping and band limiting are dynamically adjusted to improve signal quality of the signal downstream of the instrumentation amplifier for a given power consumption. In accordance with an embodiment, noise shaping and band limiting are dynamically adjusted to improve power consumption of the instrumentation amplifier for a given signal quality of the signal downstream of the instrumentation amplifier.

In accordance with an embodiment, the controller dynamically adjusts the low pass filter and the multi-path amplifiers to set the cutoff frequency equal to the crossover frequency. Alternatively, the cutoff frequency can be dynamically adjusted to be greater than or less than the crossover frequency.

In accordance with an embodiment, the noise shaping provided by each multipath amplifier is dynamically adjusted by the controller by selectively adjusting a capacitance and a reference current in the differential input transconductance stage of the high frequency path of each multipath amplifier. In one embodiment, the controller can use a lookup table and/or a search algorithm to determine which capacitance and reference current to select.

In accordance with an embodiment, the monitor is a bandwidth monitor configured to monitor a bandwidth of the signal upstream of the instrumentation amplifier. Additionally, or alternatively, a signal quality monitor is configured to monitor signal quality of the signal downstream of the instrumentation amplifier.

In accordance with an embodiment, the band limiting provided by the low pass filter is dynamically adjusted by the controller by selectively adjusting a capacitance within the low pass filter, e.g. using a lookup table and/or a search algorithm to determine which capacitance to select.

An embodiment of the present invention is also directed to a method for performing noise shaping and/or band limiting, where the method is for use with a dynamically adjustable instrumentation amplifier including a pair of buffered operational amplifiers that accept a pair of input signals, and a differential operational amplifier that outputs an output signal indicative of a difference between the pair of input signals. A signal upstream of the dynamically adjustable instrumentation amplifier and/or a signal downstream of the dynamically adjustable instrumentation amplifier is monitored and one or more monitor signals are output. Noise shaping within each of the operational amplifiers of the instrumentation amplifier is dynamically adjusted based on the monitor signal(s), which results in an increase in output voltage noise at frequencies greater than the crossover frequency. Additionally, or alternatively, passive band limiting of the output signal is dynamically adjusted based on the monitor signal(s) to thereby filter out output voltage noise at frequencies greater than a cutoff frequency.

In accordance with an embodiment, noise shaping and/or passive band limiting are dynamically adjusted to improve signal quality of the signal downstream of the dynamically adjustable instrumentation amplifier for a given power consumption of the dynamically adjustable instrumentation amplifier. In accordance with an embodiment, noise shaping and/or passive band limiting are dynamically adjusted to improve power consumption of the dynamically adjustable instrumentation amplifier for a given signal quality of the signal downstream of the dynamically adjustable instrumentation amplifier.

In accordance with an embodiment, dynamically adjusting noise shaping includes selectively adjusting a capacitance and a reference current in each multipath amplifier. In accordance with an embodiment, dynamically adjusting passive band limiting includes selectively adjusting a capacitance within a low pass filter in the dynamically adjustable instrumentation amplifier.

Further embodiments, and the features, aspects, and advantages of the present invention will become more apparent from the detailed description set forth below, the drawings and the claims.

DETAILED DESCRIPTION

Figure 1:
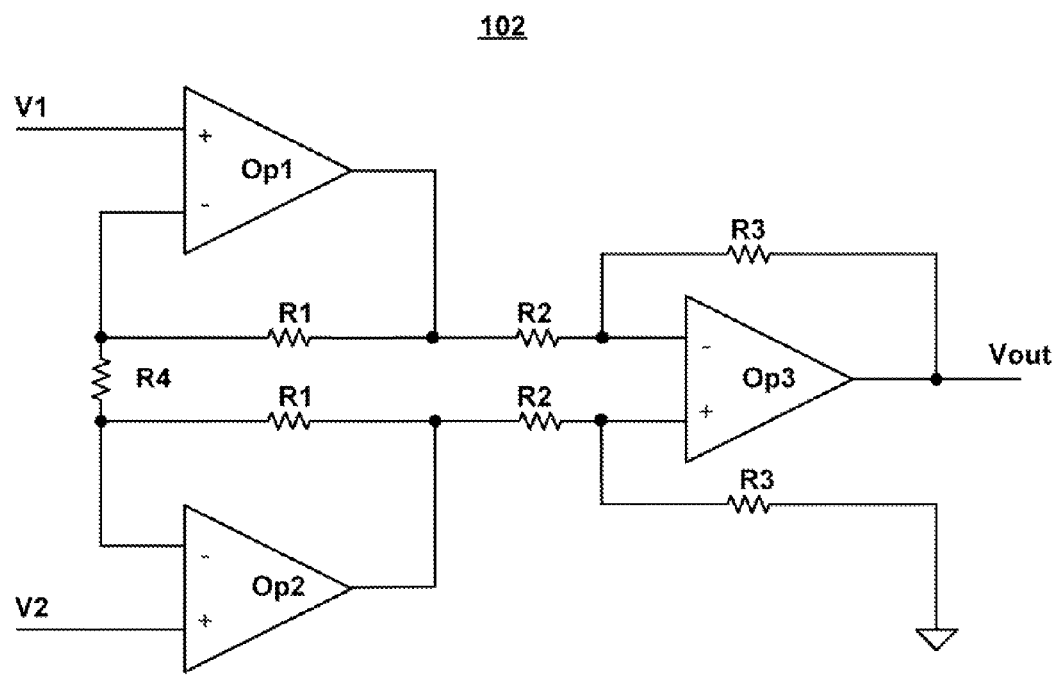
FIG. 1 illustrates a conventional "three amplifier" instrumentation amplifier including three operational amplifiers, two of which are connected as buffered operational amplifiers, and one of which is connected as a differential operational amplifier.
Figure 2A:
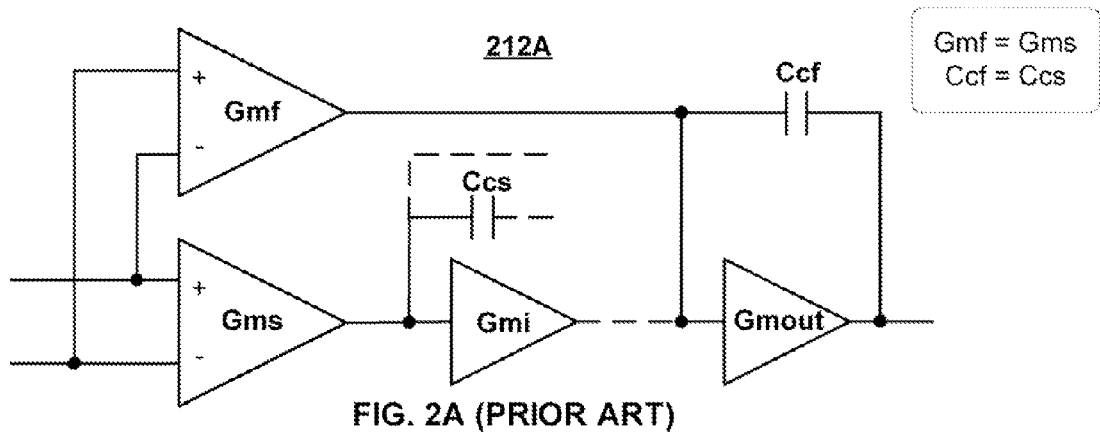
FIG. 2A illustrates a general case of a multi path operational amplifier.
Figure 2B:
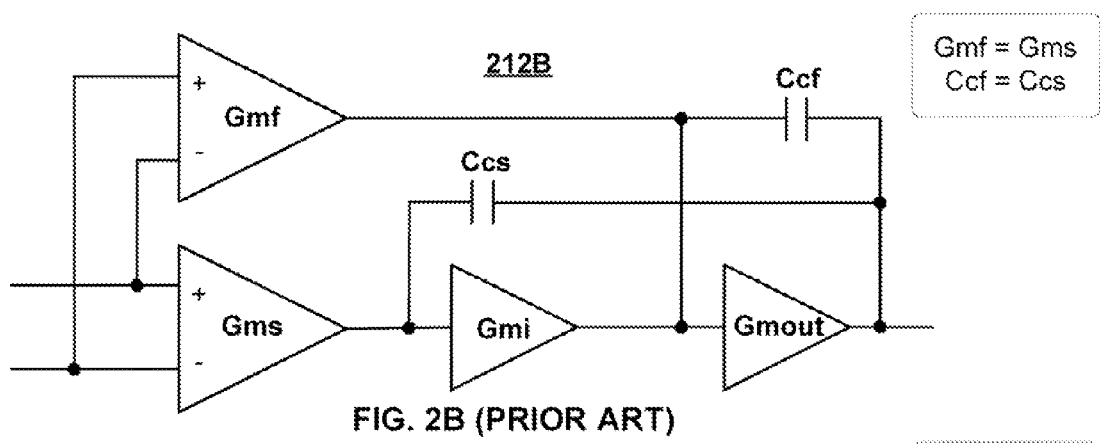
FIGS. 2B and 2C illustrate two different exemplary multi-path amplifier configurations, each of which can be used to implement all three of the operational amplifiers shown in FIG. 1.
Figure 2C:
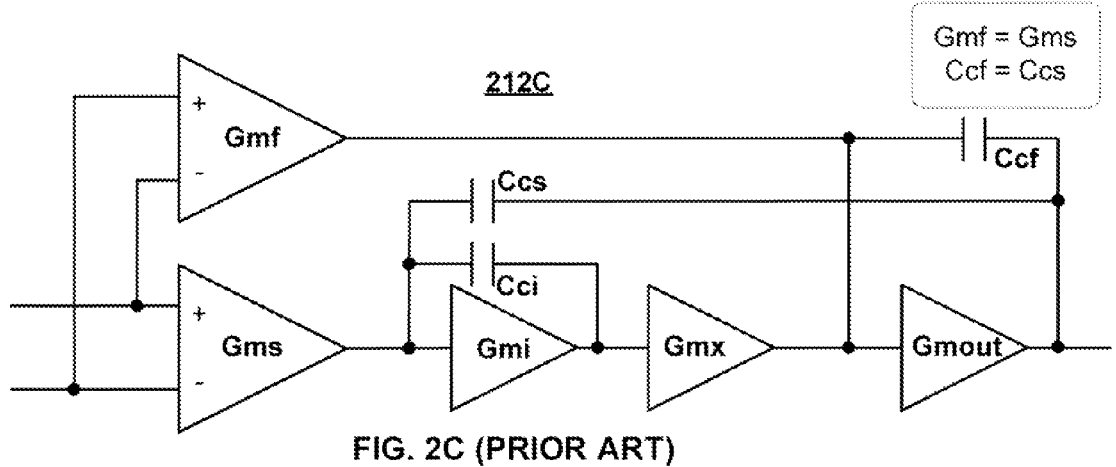
Figure 4:
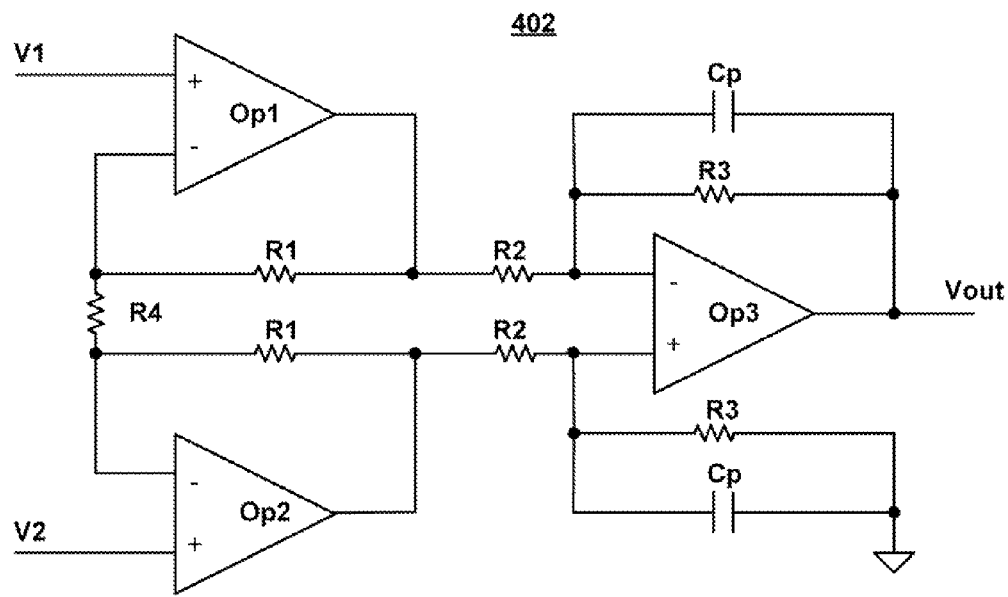
FIG. 4 illustrates an instrumentation amplifier, that includes passive low pass filtering, in accordance with an exemplary specific embodiment of the present invention.
Figure 5:
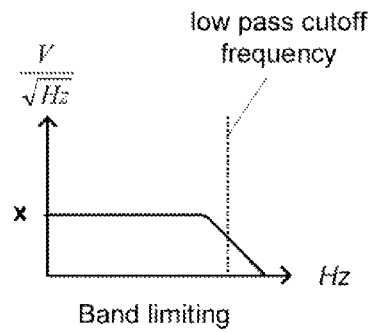
FIG. 5 illustrates the output noise spectral density response obtained by the instrumentation amplifier with passive low pass filtering of FIG. 4, where conventional transconductance and capacitor values are used.

FIG. 4 illustrates an instrumentation amplifier 402, that include passive low pass filtering (also referred to as passive band limiting), in accordance with an embodiment of the present invention. The instrumentation amplifier 402 resembles the instrumentation amplifier 102 of FIG. 1, but with capacitors Cp added in parallel with the resistors R3. Each operational amplifier of the instrumentation amplifier 402 can be a multi-path amplifier (examples of which were discussed with reference to FIGS. 2A, 2B and 2C), where Gms=Gmf and Ccs=Ccf. The added capacitors Cp cause band limiting (and more specifically, low pass filtering) of the output of the instrumentation amplifier, as can be appreciated from the resulting noise spectral density response shown in FIG. 5. Because the capacitors Cp are passive devices, the band limiting is passive band limiting. The RC pole frequency, illustrated by a dashed line in FIG. 5, equals 1/(R3*Cp) radians/second. The instrumentation amplifier 402 can be especially useful where frequencies below a specified frequency (defined by the RC pole) are the frequencies of interest. The adding of the capacitors Cp is only one exemplary way that an RC pole can be provided to add passive band limiting of the output of the instrumentation amplifier. More generally, a low pass filter is added, which is configured to low pass filter the output of the instrumentation amplifier. One of ordinary skill in the art would appreciate from this description that there are numerous alternative ways to implement such a low pass filter that are also within the scope of the present invention. For example, it is also within the scope of the present invention that the low pass filter be implemented within the differential operational amplifier OP3.

Further, it is noted that the differential operational amplifier OP3 could have a differential output (i.e., a pair of output terminals), instead of a single ended output. In that cause, the output signal of the instrumentation amplifier would be a differential output signal. Further, in that case, e.g., the resistor R3 and the capacitor Cp that are shown in FIG. 4 as being connected between the non-inverting (+) input of the differential operational amplifier OP3 and ground, could instead be connected between the non-inverting (+) input of the differential operational amplifier OP3 and the further output terminal of the differential operational amplifier OP3.

Figure 6A:
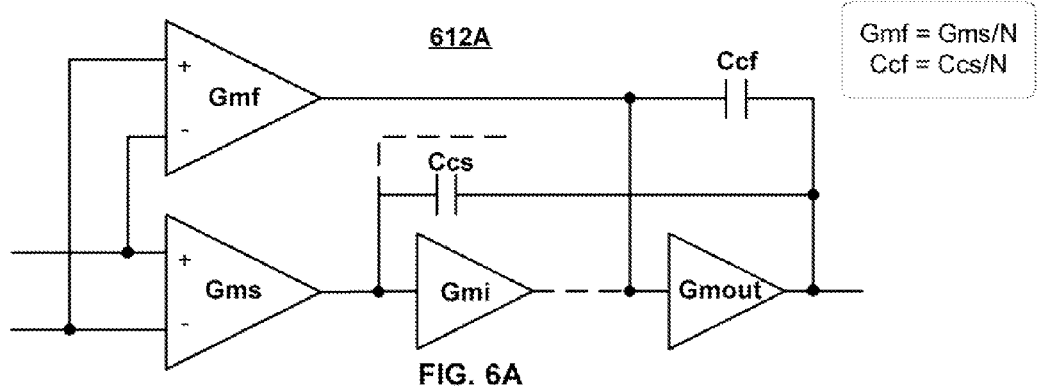
FIG. 6A illustrates a general case of a multi path operational amplifier with transconductance and capacitor values selected to provide noise shaping, in accordance with an embodiment of the present invention.
Figure 6B:
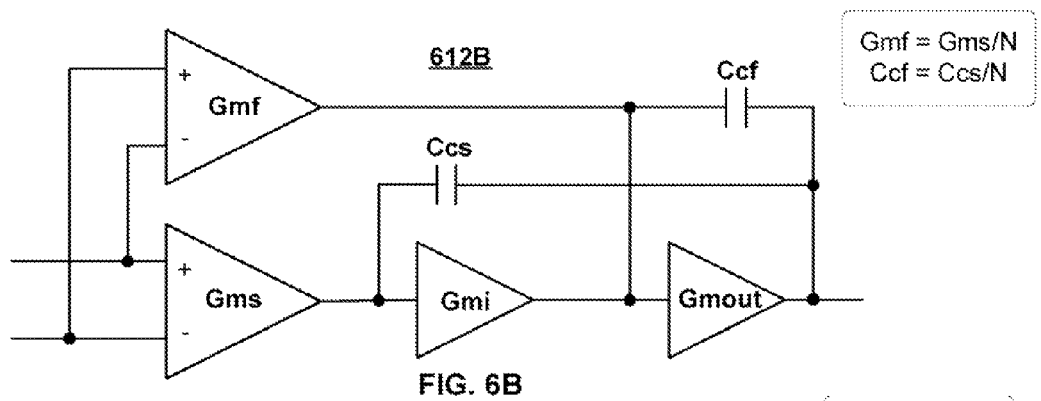
FIGS. 6B and 6C illustrate two different exemplary multi-path amplifier configurations with transconductance and capacitor values selected to provide noise shaping, in accordance with an embodiment of the present invention.
Figure 6C:
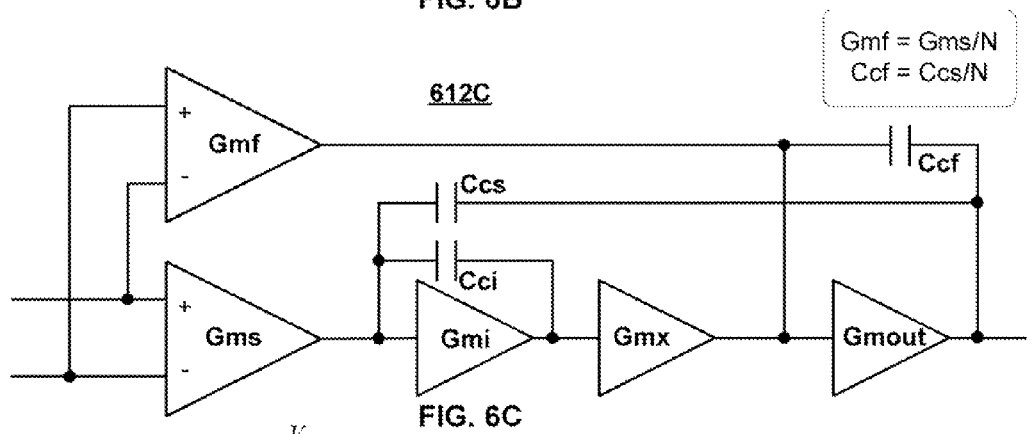

In accordance with an embodiment of the present invention, each operational amplifier (i.e., Op1, Op2 and Op3) of the instrumentation amplifier 402 is a multi-path amplifier that provides noise shaping, such that noise increases above a specified frequency. FIGS. 6A, 6B and 6C illustrate different exemplary multi-path amplifier configurations 612A, 612B and 612C, respectively, with transconductance and capacitor values selected to provide noise shaping, in accordance with an embodiment of the present invention. In these configurations, Gmf=Gms/N and Ccf=Ccs/N, where N>1. Preferably N is at least 5, but can be significantly greater. Note that the Ccf is reduced by the same amount (e.g., N) as Gmf, so that time constants of integrations performed by the low and high frequency paths remain the same. More generally, the ratio Gmf/Ccf should remain equal to the ratio Gms/Ccs, to provide the same integration time constants, which provides a smooth roll-off at the crossover frequency for the overall amplifier.

The input referred voltage noise of a transconductance stage is roughly $$\sim \sqrt{\frac{1}{Gm}}.$$

Figure 7:
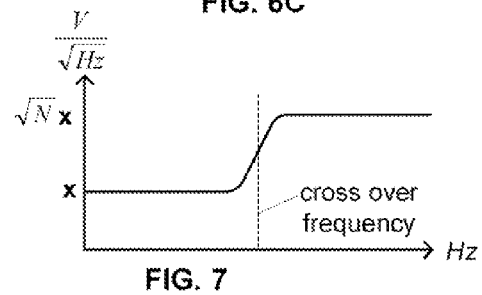
FIG. 7 illustrates a noise spectral density response obtained by an instrumentation amplifier resembling that of FIG. 1, implemented using one of the exemplary multi-path amplifiers in FIGS. 6A, 6B and 6C with transconductance and capacitor values selected to provide noise shaping, in accordance with an embodiment of the present invention.

Thus, if Gmf=Gms/N, then when referred to the output the voltage noise produced by Gmf will be $\sim\sqrt{N}$ greater than the noise produced by Gms. For example, if N=9, then Gmf=Gms/9, and the noise generated by Gmf will be ~3 times greater than the noise generated by Gms. Thus, in this example, if the noise generated by Gms=x, then the noise generated by Gmf ~3*x, or more generally, $\sim\sqrt{N}$*x. Such an output voltage noise spectral density response is shown in FIG. 7. More specifically, FIG. 7 illustrates a noise spectral density response obtained by an instrumentation amplifier resembling that of FIG. 1, implemented using one of the exemplary multi-path amplifiers in FIGS. 6A, 6B and 6C with transconductance and capacitor values selected to provide noise shaping, in accordance with an embodiment of the present invention. The crossover frequency, illustrated by a dashed line in FIG. 7, is dependent on the relative open loop gain of the low frequency path of the multi-path amplifier compared to the open loop gain of the high frequency path. At frequencies below the crossover frequency, the open loop gain of the low frequency path is higher, and thus the noise from the low frequency path dominates the output noise. At frequencies above (i.e., greater than) the crossover frequency the open loop gain of the high frequency path is higher, and this the noise from the high frequency path dominates the output noise.

Because Gmf is N times smaller than Gms, and Ccf is N times smaller than Ccs, the high frequency path of each of the multi-path amplifier configurations 612A, 612B and 612C will draw less current and thus consume less power (a factor of approximately N less power for a bipolar or subthreshold MOSFET transconductance) than the low frequency paths. This is illustrative of a noise versus power consumption tradeoff. As will be described below, an embodiment of the present invention takes advantage of this noise versus power consumption trade-off.

As indicated in FIGS. 6A, 6B and 6C, the transconductance of Gmf is a factor of N smaller than the transconductance of Gms. This can be accomplished by a simple rationing of the bias currents to the two transconductors Gmf and Gms, but is not limited thereto.

Figure 8:
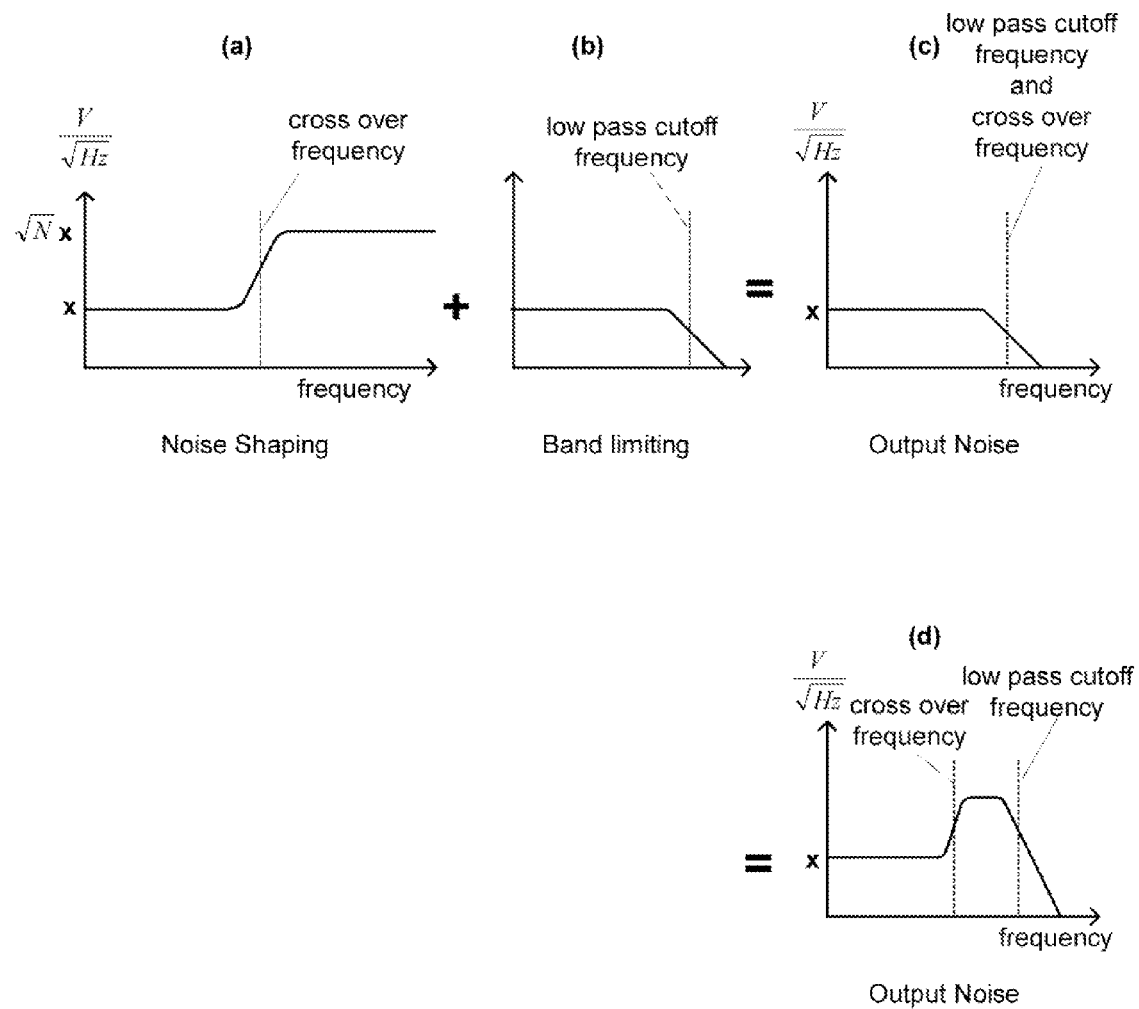
FIG. 8 illustrates how the noise shaping explained with reference to FIGS. 6A, 6B and 6C can be combined with the passive low pass filtering explained with reference to FIG. 4, to provide an instrumentation amplifier with improved noise versus power tradeoff, in accordance with an embodiment of the present invention.

FIG. 8 will now be used to explain how the noise shaping explained with reference to FIGS. 6A, 6B and 6C can be combined with the passive low pass filtering explained with reference to FIG. 4, to provide an instrumentation amplifier with improved output voltage noise versus power tradeoff, in accordance with an embodiment of the present invention. More specifically, by making the transconductance of GmfN times smaller than the transconductance of Gms, and making the capacitance of CcfN times smaller than the capacitance of Ccs, the high frequency paths of the multi-path amplifiers 402 (used to implement Op1, Op2 and Op3) in FIG. 4, will draw less current and thus consume less power than the low frequency paths, but will produce more noise as can be appreciated from the noise spectral response (a) shown in FIG. 8. This increase in noise at frequencies above (i.e., greater than) the crossover frequency is acceptable, since a low pass filter (e.g., including the capacitors Cp in FIG. 4) is used to filter out output voltage noise at frequencies above a low pass cutoff frequency. More specifically, by setting the cutoff frequency (e.g., an RC pole frequency) to be equal to (or lower than) the crossover frequency, the noise spectral frequency response shown in (c) of FIG. 8 is achieved.

The crossover frequency, as the term is used herein, is the frequency below which the noise of the low frequency path of a multi-path amplifier dominates the input referred noise, and above which the noise of the high frequency path of the multi-path amplifier dominates the input referred noise. In graph (c) of FIG. 8, the RC pole frequency is shown as being set such that it is the same as the crossover frequency. However, as mentioned above, it is also within the scope of the present invention for the RC pole to be set such that it is below the crossover frequency. This can advantageously allow the signal-to-noise ratio (SNR) of an instrumentation amplifier to be improved where only extremely low frequency signals (e.g., signals having a frequency of 2 kHz or lower) need to be processed by the instrumentation amplifier.

Conversely, if the signals to be processed by the instrumentation amplifier are comparable to the crossover frequency (e.g., if the signal being processed has signal content at frequencies greater than half of the crossover frequency), then the RC pole can be extended beyond the crossover frequency (i.e., the RC pole frequency can be greater than the crossover frequency). While this can result in a bump in the noise spectrum, as shown in (d) of FIG. 8, the overall SNR can be improved. Accordingly, it is also within the scope of the present invention for the RC pole to be set such that it is above the crossover frequency. Alternative configurations for setting the low pass cutoff frequency are also within the scope of the present invention, as mentioned above.

Figure 3:
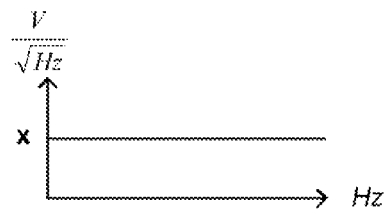
FIG. 3 illustrates a flat output voltage noise spectral density response obtained by the conventional instrumentation amplifier of FIG. 1, implemented using one of the exemplary multi-path amplifiers in FIGS. 2B and 2C with conventional transconductance and capacitor values. Ideal operational amplifiers with infinite bandwidth are assumed for the purpose of this illustration. It is also assumed that the low frequency (e.g. 1/f) noise is negligible, which can be achieved using circuit techniques such as chopping.
Figure 9A:
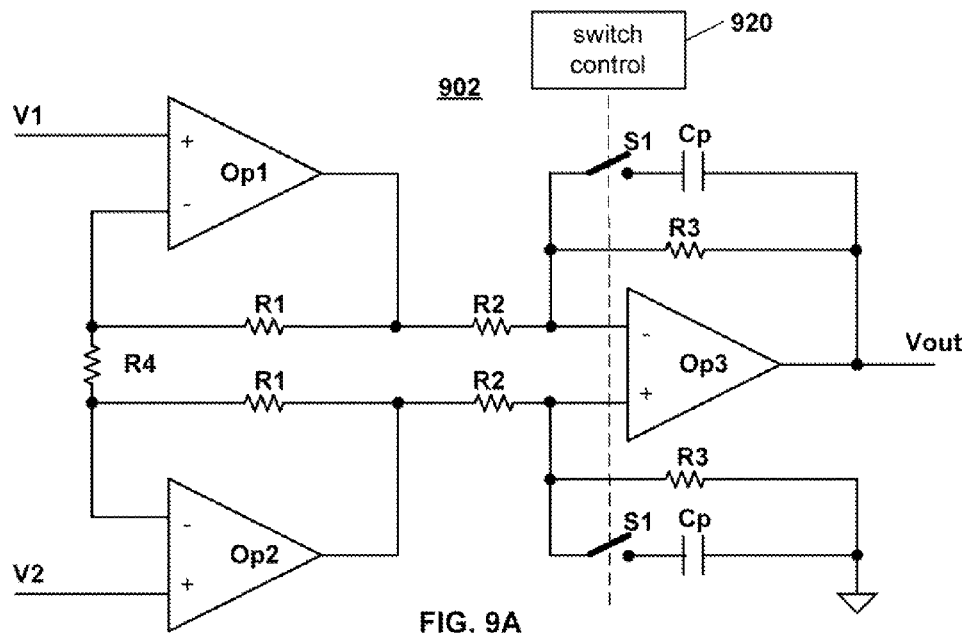
FIGS. 9A and 9B are used to illustrate an instrumentation amplifier that can be selectively switched between having the flat response of FIG. 3 and a noise shaping and band limiting response, e.g., the response (c) of FIG. 8, in accordance with an embodiment of the present invention.
Figure 9B:
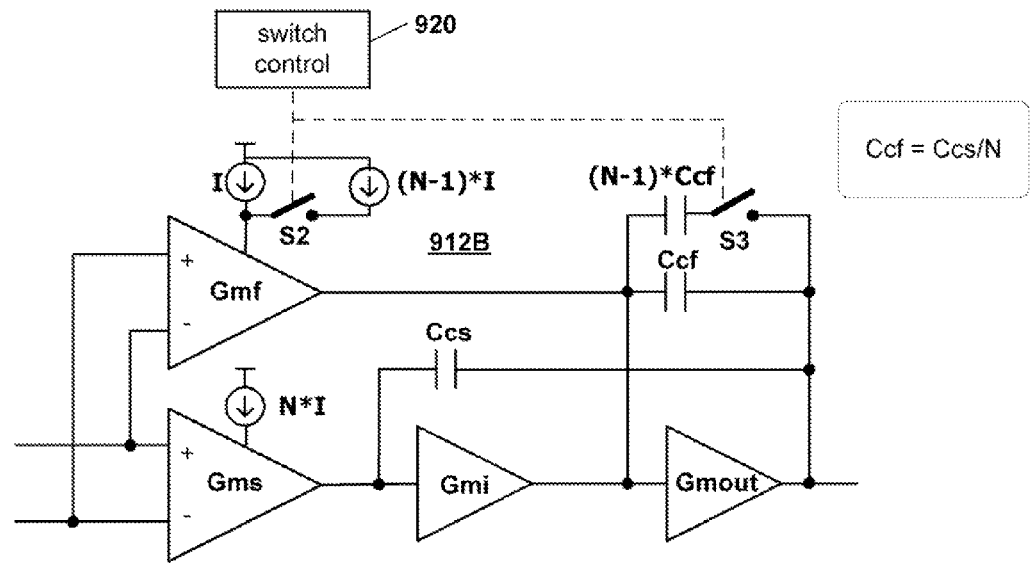

FIGS. 9A and 9B are used to illustrate an instrumentation amplifier 902 that can be selectively switched between having the flat response of FIG. 3 and a noise shaping and band limiting response, e.g., the response (c) of FIG. 8. FIG. 9B illustrates an exemplary multi-path amplifier that can be used to implement each of operational amplifiers (i.e., Op1, Op2 and Op3) in FIG. 9A, but embodiments of the present invention should not be limited to only these specific configurations. When the switches S1 are open (in FIG. 9A) and the switches S2 and S3 (in FIG. 9B) are closed, the instrumentation amplifier 902 will be configured to have the same configuration as instrumentation amplifier 102 (in FIG. 1), with each of the three operational amplifiers configures as the multi-path amplifier 212B (in FIG. 2B), resulting in a flat noise spectral density response resembling FIG. 3. When the switches S1 are closed (in FIG. 9A) and the switches S2 and S3 (in FIG. 9B) are opened, the instrumentation amplifier 902 will be configured as the instrumentation amplifier 402 (in FIG. 4), with each of the three operational amplifiers configured as the multi-path amplifier 612B (in FIG. 6B), resulting in noise shaping and band limiting, e.g., the frequency response (c) of FIG. 8. This enables a user to select between a flat frequency response (resembling FIG. 3) and a noise shaping and band limited frequency response (e.g., resembling (c) of FIG. 8) that consumes less power, depending upon the needs of the user.

A controller 920, which can be used to control the switches S1, S2 and S3, can be implemented, e.g., using logic, a processor, and/or a state machine. In an embodiment, the switches S1, S2 and S3 can be controlled by connecting a pin of an integrated circuit (implementing an embodiment of the present invention) to either a high or low voltage rail. The connecting of such a pin to either a high or low voltage rail can be a one time connection, or the connection can be changed (e.g., by a processor, through programming, or manually).

The switches S1, S2 and S3 can be implemented, e.g., using transistors. For example, the switches S1 can be implemented by N-channel transistors, and the switches S2 and S3 can be implemented by P-channel transistors, so that when a pin controlling the switches is low, the instrumentation amplifier 902 will have a flat response, and when the pin controlling the switches is high, the instrumentation amplifier 902 will have the frequency response (c) of FIG. 8. Numerous other configures are possible, and within the scope of the present invention.

An instrumentation amplifier that includes band pass limiting and noise shaping, in accordance with an embodiment of the present invention, can be used to provide the same output noise within the frequency band of interest as a conventional instrumentation amplifier, but with significant current and power savings in the input transconductance. This input transconductance will often consume a large proportion of the overall power in a low noise design. Additionally, within the frequency band of interest, DC gain and slew capability are maintained. Thus, embodiments of the present invention can be used to provide significant improvement in noise versus power tradeoff for an instrumentation amplifier.

The use of alternative multi-path amplifiers (i.e., other than the ones shown in the FIGS.) are also within the scope of the present invention. For example, additional transconductance stages can be added. For other examples, one or more choppers can be added within the low frequency path of each multi-path amplifier to provide chopper stabilization, and/or a filter (e.g., a continuous time notch filter) can be added within each low frequency path, as disclosed in U.S. patent application Ser. No. 12/144,384, entitled "Chopper Stabilized Amplifiers" (Luff), filed Jun. 23, 2008, which is incorporated herein by reference.

In some embodiments, the instrumentation amplifiers of embodiments of the present invention can be implemented using discrete circuitry, e.g., discrete operational amplifiers, resistors, capacitors, and the like. In other embodiments, the instrumentation amplifiers of embodiments of the present invention can be implemented as integrated circuits, which may or may not be part of larger integrated circuits.

Figure 10:
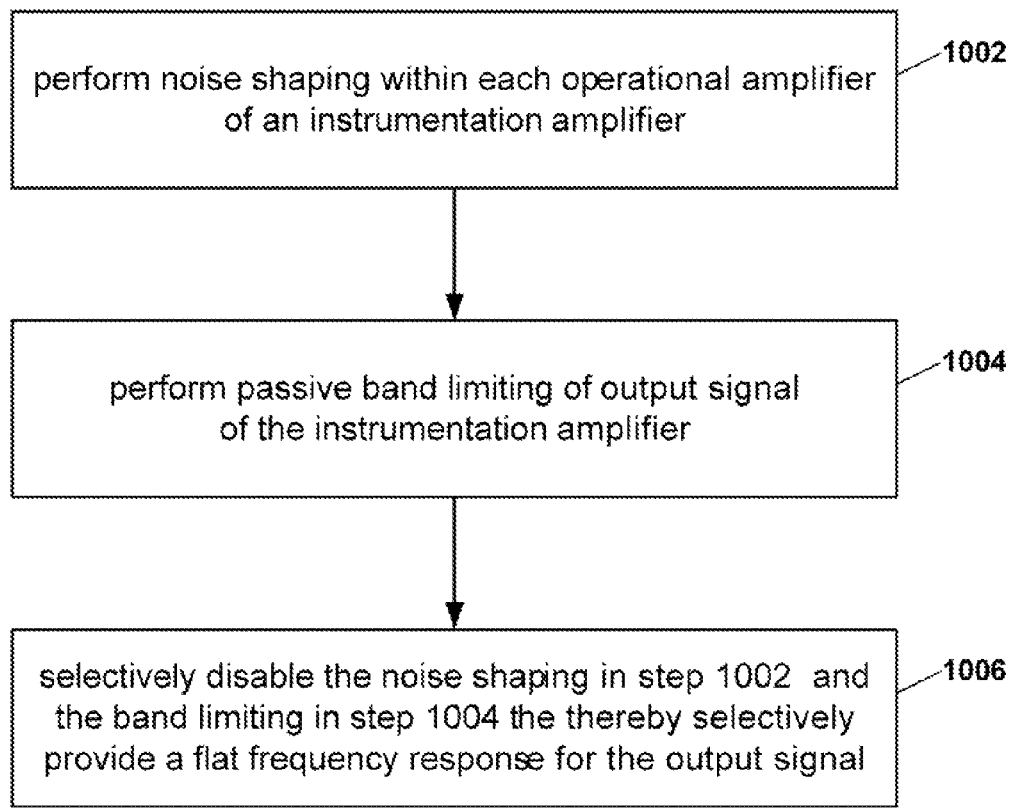
FIG. 10 is a high level flow diagram of a method for performing noise shaping and band limiting, in accordance with an embodiment of the present invention.

FIG. 10 is a high level flow diagram of a method for performing noise shaping and band limiting, in accordance with an embodiment of the present invention. This method is for use with an instrumentation amplifier including a pair of buffered operational amplifiers (e.g., OP1 and OP2 in FIG. 4) that accept a pair of input signals V1 and V2, and a differential operational amplifier (e.g., OP3 in FIG. 4) that outputs an output signal Vout indicative of a difference between the pair of input signals V1 and V2. Referring to FIG. 10, at step 1002, noise shaping is performed within each of the operational amplifiers (e.g., OP1, OP2 and OP3 in FIG. 4), which results in an increase in output voltage noise at frequencies greater than the crossover frequency. As was explain above, such noise shaping can be performed by appropriate ratioing of input transconductance stages (e.g., Gms and Gmf) within the operations amplifiers implemented as multi-path amplifiers, and appropriate ratioing of capacitors (e.g., Ccs and Ccf) within the multi-path amplifiers. As indicated at step 1004, passive band limiting of the output signal Vout is performed (e.g., using capacitors Cp in FIG. 4) to thereby filter out output voltage noise at frequencies greater than a cutoff frequency. For the reasons explain above, less current and power is drawn when such noise shaping and band limiting is performed, as compared to when the circuit provides a flat frequency response for the output signal Vout.

As was explained above, in accordance with an embodiment, the cutoff frequency in step 1004 is equal to the crossover frequency in step 1002. In another embodiment, cutoff frequency in step 1004 is less than the crossover frequency in step 1002. In still another embodiment, the cutoff frequency in step 1004 is greater than the crossover frequency in step 1002.

In accordance with an embodiment, the noise shaping in step 1002 and the band limiting in step 1004 can be selectively disabled, e.g., using switches, to thereby selectively provide a flat frequency response for the output signal Vout, as indicated at step 1006.

Figure 11A:
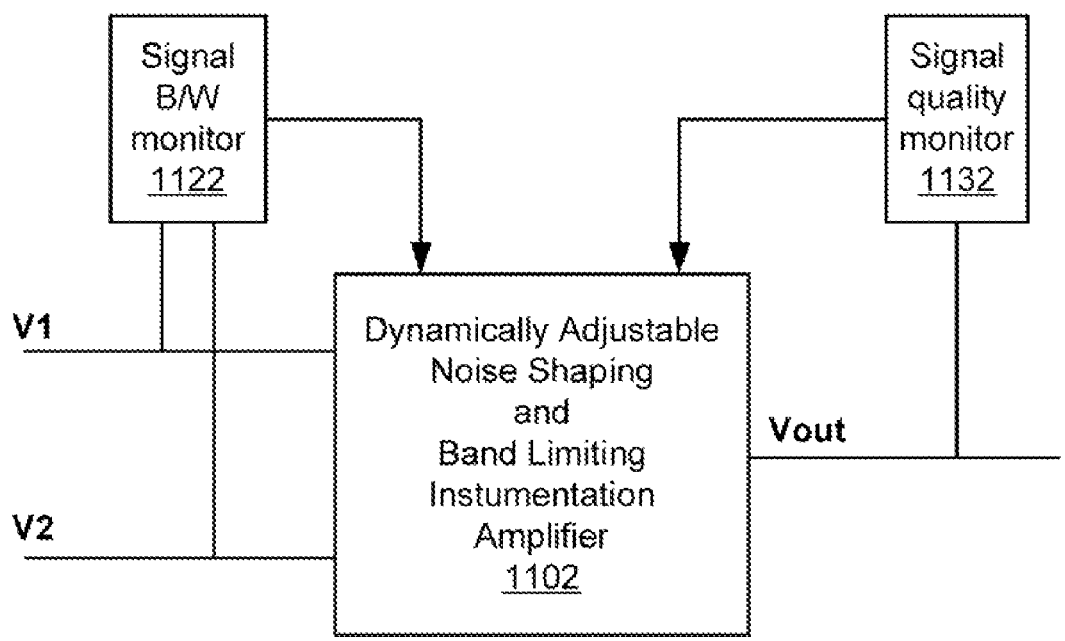
FIG. 11A illustrates a block diagram of a system including a dynamically adjustable noise shaping and band limiting instrumentation amplifier, in accordance with an embodiment of the present invention.

FIG. 11A illustrates a block diagram of a system including dynamically adjustable noise shaping and band limiting instrumentation amplifier 1102, in accordance with an embodiment of the present invention. As shown in FIG. 11A, a signal bandwidth monitor 1122 can be used to monitor a signal upstream of the dynamically adjustable noise shaping and band limiting instrumentation amplifier 1102, such as the input signal. Additionally, or alternatively, the output, or other signal downstream of the dynamically adjustable noise shaping and band limiting instrumentation amplifier 1102 can be monitored by a signal quality monitor 1132. Using the signal bandwidth monitor 1122 and/or the signal quality monitor 1132, the noise shaping and/or band limiting provided by the instrumentation amplifier 1102 can be dynamically adjusted based on the measured bandwidth of such upstream signals and/or the signal quality of such downstream signals (e.g., to reduce and preferably optimize power consumption and/or increase and preferably optimize signal quality).

Dynamically adjusting the noise shaping provided by the instrumentation amplifier 1102 can include dynamically adjusting the ratio of input transconductance stages (e.g., to effect a particular power consumption level), thereby dynamically adjusting the output voltage noise at frequencies greater than the crossover frequency of the instrumentation amplifier 1102. Band limiting can then be dynamically adjusted to increase (and preferably optimize) signal quality by dynamically adjusting the cutoff frequency of the low pass filter of instrumentation amplifier 1102. Similarly, dynamically adjusting the band limiting provided by the instrumentation amplifier 1102 can include dynamically adjusting the cutoff frequency of instrumentation amplifier 1102 (e.g., by dynamically adjusting the value of Cp, as is discussed in more detail below), to effect a particular signal quality. Noise shaping can then be dynamically adjusted to reduce power (e.g., by adjusting the output voltage noise at frequencies greater than the crossover frequency of instrumentation amplifier 1102).

A particular implementation of the bandwidth monitor 1122 can vary with the anticipated input signal it would be used to monitor. In one embodiment, the signal bandwidth monitor 1122 can include several bandpass filters, each configured to measure energy received in a different frequency band. By comparing the energy received in the different frequency bands, a bandwidth of the incoming signal can be approximated, e.g., by identifying the frequency band with the highest energy. In accordance with another embodiment, the signal bandwidth monitor 1122 can include a single bandpass filter configured to sweep across various frequency bands (e.g., using a variable capacitor) and measure the energy received in the different frequency bands. As in the previously described embodiment, the energy received in several frequency bands can be compared to thereby approximate a bandwidth of the incoming signal. These are just a few examples of how the bandwidth monitor 1122 can be implemented. Other implementations of the bandwidth monitor 1122 are also within the scope of the present invention.

In another embodiment, where the input to the instrumentation amplifier 1102 is expected to receive a single frequency (e.g., an amplitude modulated signal), the signal bandwidth monitor 1122 can be used to detect such a single frequency, e.g., using a phase lock loop (PLL) configured to identify the frequency of a single frequency input.

In accordance with an embodiment of the present invention, the signal quality monitor 1122 can comprise any signal quality monitor as is generally known by one of ordinary skill in the art. In accordance with an embodiment, signal quality can be monitored by measuring output parameters such as noise, signal-to-noise ratio (SNR), bit error rate (BER), intersymbol interference (ISI), the opening of an eye diagram or any other output parameter of interest. The SNR of a signal downstream of the instrumentation amplifier can be measured directly by measuring the noise floor of the instrumentation amplifier with no signal at the input, and then providing a narrowband input signal to the input of the instrumentation amplifier and measuring the output. The ratio of the measured output to the measured noise floor will yield the SNR. SNR can also be measured indirectly by measuring output parameters, such as those described above, or any other output parameter adversely affected by noise. These are just a few examples of how the signal quality monitor 1132 can be implemented. Other implementations of the signal quality monitor 1132 are also within the scope of the present invention.

Figure 11B:
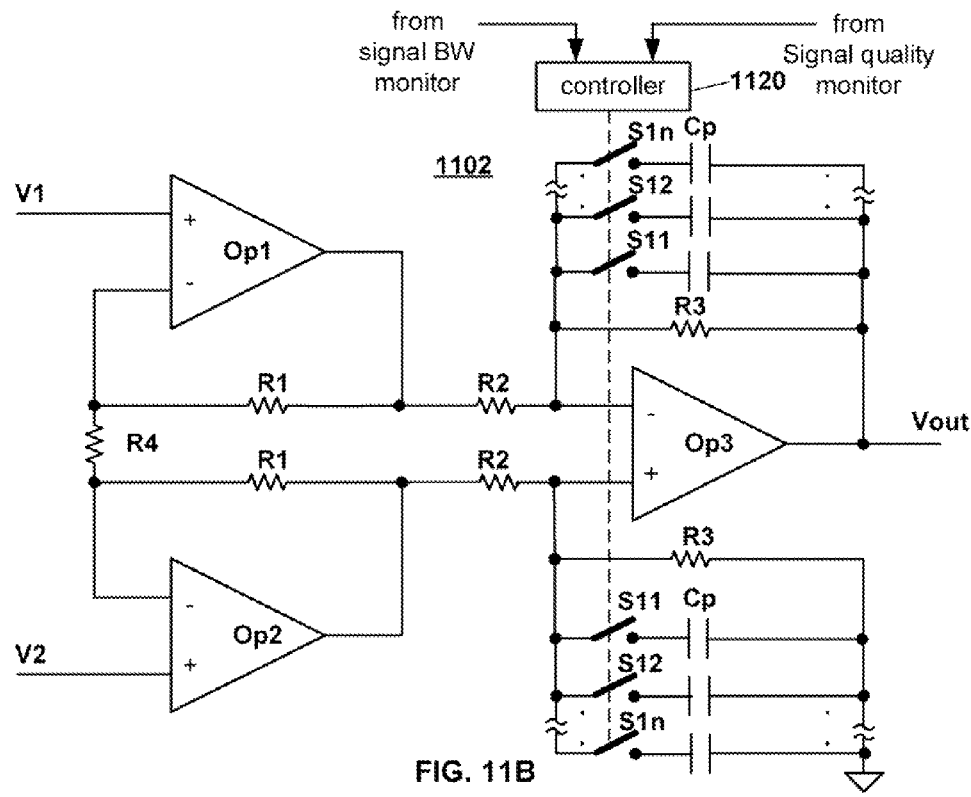
FIG. 11B illustrates a dynamically adjustable "three amplifier" instrumentation amplifier, in accordance with an embodiment of the present invention.

FIG. 11B illustrates a dynamically adjustable "three amplifier" instrumentation amplifier, in accordance with an embodiment of the present invention. The dynamically adjustable "three amplifier" instrumentation amplifier 1102 is similar to the one discussed with reference to FIG. 4, but including a dynamically adjustable low pass filter and also including a controller 1120 operable to control the value of Cp. As was discussed above with respect to FIG. 4, the capacitor Cp in FIG. 11B is used to passively band limit (low pass filter) the output of the instrumentation amplifier. By controlling the value of Cp using the controller 1120, the RC pole frequency (equal to $1/(R3*Cp)$ radians/second) can be dynamically controlled based on one or more monitor signal(s) received from the bandwidth monitor 1122 and/or the signal quality monitor 1132. As described above, the RC pole frequency corresponds to the low pass cutoff frequency, therefore dynamically adjusting the value of Cp allows the band limiting characteristics of instrumentation amplifier 1102 to be dynamically adjusted. Where a monitor signal is received from the bandwidth monitor 1122, the monitor signal can inform the controller 1120 of the bandwidth of the input signals being provided to the instrumentation amplifier 1102. Where a monitor signal is received from the signal quality monitor 1132, the monitor signal can inform the controller 1120 of the signal quality of the signal output by the instrumentation amplifier 1102. As will be described in additional detail below, the controller 1120 can dynamically adjust the noise shaping and/or band limiting provided by the instrumentation amplifier 1102, based on such monitor signal(s) (e.g., by dynamically adjusting the value of Cp). Additionally, or alternatively, other measurable characteristics can be monitored and used by the controller 1120 to dynamically adjust the noise shaping and/or band limiting provided by the instrumentation amplifier 1102. The controller 1120 can be implemented as a microcontroller, microprocessor, state machine, or any other controller known in the art.

As shown in FIG. 11B, one or more capacitors can be selectively connected in parallel with each of the resistors R3 to adjust the value of Cp, and thereby adjust the low pass cutoff frequency of the instrumentation amplifier 1102. Such capacitors shown in FIG. 11B can be equally weighted, or differently weighted (e.g., binary weighted) to provide a larger range of values for Cp. In accordance with an embodiment, the controller 1120 can control switches S11, S12, . . . , S1n to selectively add or remove the capacitors from the circuit. The controller 1120 can determine which capacitor(s) should be in parallel with R3 in various different manners. For example, the controller 1120 can use a lookup table which includes a predetermined Cp value (and accordingly, which capacitors should be in parallel with R3) for each of a plurality of given input bandwidths. In addition to the embodiment of FIG. 11B, other implementations for selectively adjusting a capacitance value (e.g., using a variable capacitor) are also within the scope of the present invention. In accordance with an alternative embodiment, the controller 1120 can determine an appropriate value of Cp for a given monitor signal using an algorithm, e.g., a search algorithm such as a binary search algorithm, as is known in the art. Other implementations for determining an appropriate value for Cp are also within the scope of the present invention. Additionally, although FIG. 11B illustrates a first-order low pass filter, higher order low pass filters as well as other filters and any other means for selectively attenuating signals above a cutoff frequency are also within the scope of the present invention.

Figure 11C:
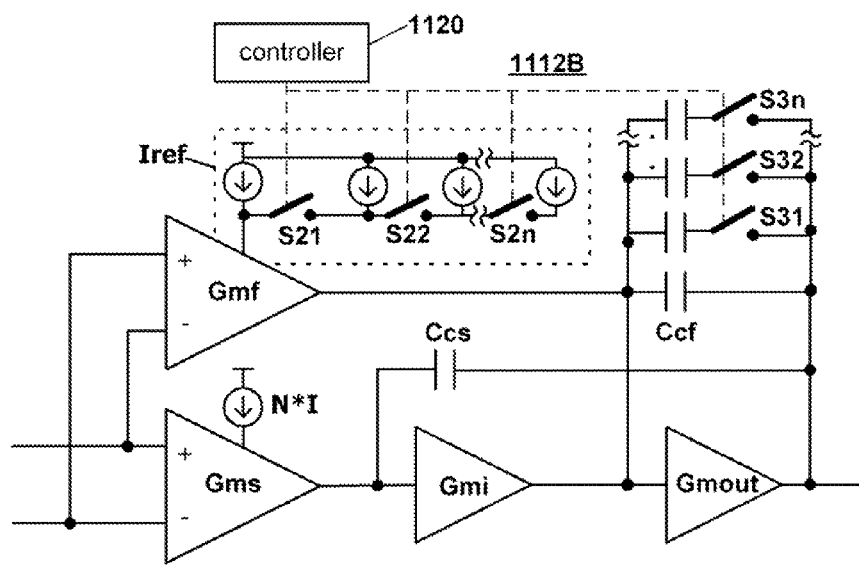
FIG. 11C illustrates an exemplary dynamically adjustable multipath amplifier, in accordance with an embodiment of the invention.

FIG. 11C illustrates an exemplary dynamically adjustable multipath amplifier, in accordance with an embodiment of the invention. The dynamically adjustable multipath amplifier 1112B further includes the controller 1120 operable to control a reference current Iref and a capacitance Ccf to dynamically adjust the input transconductance stage Gmf and capacitance of Ccf. In accordance with an embodiment, the controller 1120 controls switches S21, S22, . . . , S2n and S31, S32, . . . S3n which each enable the value of Iref or Ccf to be selected dynamically by adding or removing current sources and capacitors to or from the circuit, thus controlling the input transconductance stage Gmf and the capacitance Ccf and thereby dynamically adjusting the output voltage noise at frequencies greater than the crossover frequency of the multipath amplifier. Each current source and capacitor can be equally weighted or differently weighted (e.g., binary weighted) to provide a larger range of values for Iref and Ccf. Additionally, the controller 1120 can determine which current sources and capacitors should be added to or removed from the circuit in various different ways, such as those described above with respect to FIG. 11B. Other implementations for dynamically adjusting a reference current and capacitance, such as by using a variable current source, a voltage-controlled current source, variable capacitors, or any other component or combination of components that provide an adjustable current or capacitance, are also within the scope of the present invention.

As described above with respect to FIGS. 6A, 6B and 6C, noise shaping allows for a power-noise tradeoff (e.g., lower power consumption at the cost of generating more noise at higher frequencies). High frequency noise that is generally above the bandwidth of interest is acceptable because this noise can then be filtered using a low pass filter, such as is shown in FIG. 11B. In accordance with an embodiment, by controlling and dynamically adjusting both the band limiting properties of the instrumentation amplifier and the noise shaping properties of each operational amplifier, power consumption for a given signal quality can be improved, and preferably optimized. For example, the value of Cp (and therefore the low pass cutoff frequency of the instrumentation amplifier) can be chosen to effect a particular signal quality. The noise shaping characteristics of the instrumentation amplifier can then be dynamically adjusted to reduce power consumption while maintaining the selected signal quality. As described above, the noise shaping characteristics can be controlled by dynamically adjusting the values of Iref and Ccf (and therefore the output voltage noise at frequencies greater than the crossover frequency of the instrumentation amplifier). Depending on the application, dynamically adjusting the noise shaping and band limiting can result in the crossover and cutoff frequencies being equal, resulting in a frequency response such as is shown in (c) of FIG. 8. However, in other applications an acceptable signal quality can be maintained while increasing the output voltage noise at frequencies greater than the crossover frequency (and therefore reducing the power consumption). For example, when the cutoff frequency is greater than the crossover frequency, such as is shown in (d) of FIG. 8, the noise introduced between the crossover frequency and the cutoff frequency can be increased to reduce power until the signal quality begins to drop below an acceptable value or threshold.

In another embodiment, signal quality can be improved for a given power consumption. For example, if a given application requires that power consumption be limited to a particular level, values of Iref and Ccf can be selected to achieve that particular power consumption level. As described above, the values of Iref and Ccf will determine the input transconductance stage Gmf, thereby setting the output voltage noise at frequencies greater than the crossover frequency of the amplifier. The controller can then monitor the signal quality of the output signal and dynamically adjust the cutoff frequency (by controlling the value of Cp, as shown above in FIG. 11B), to improve, and preferably optimize, signal quality while keeping power consumption generally constant or at least below a threshold level.

Figure 12:
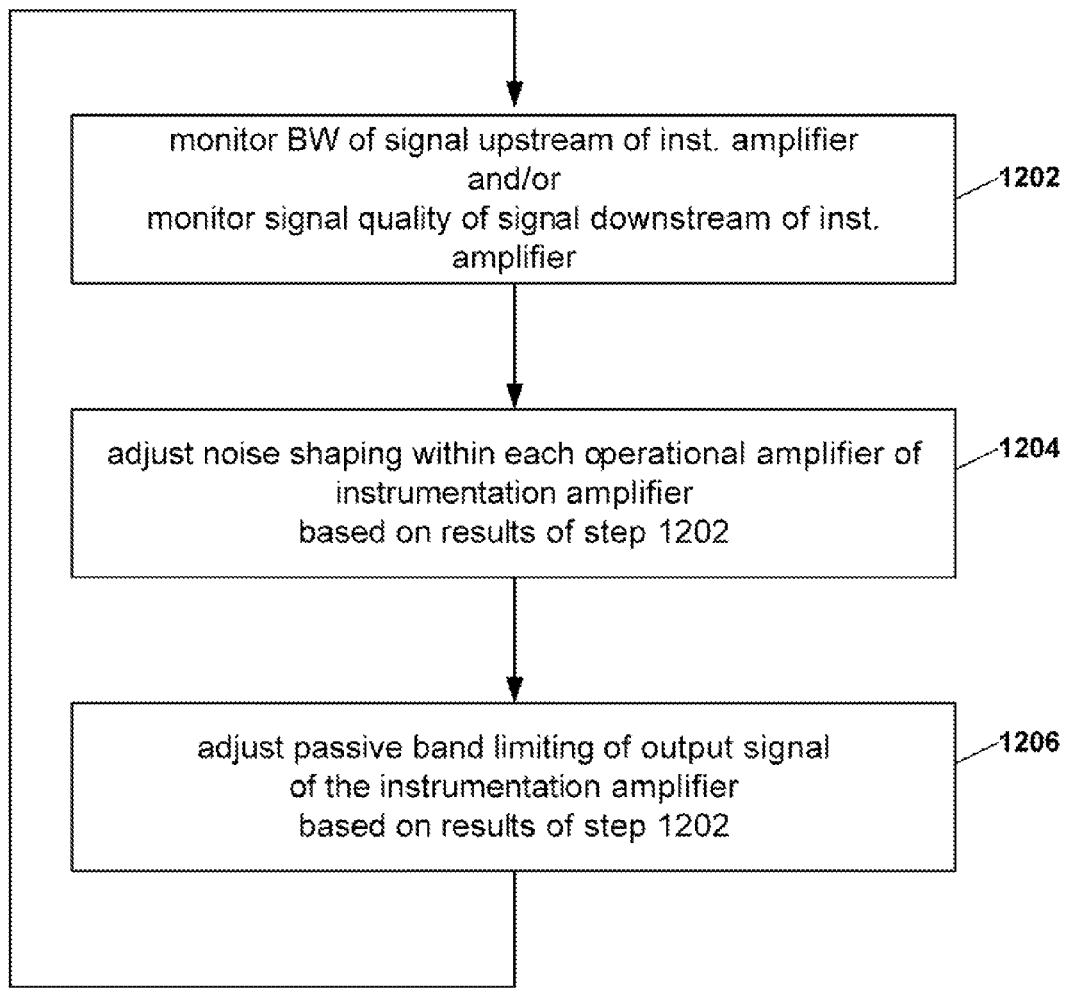
FIG. 12 is a high level flow diagram of a method for dynamically adjusting noise shaping and/or band limiting, in accordance with an embodiment of the present invention.

FIG. 12 is a high level flow diagram of a method for dynamically adjusting noise shaping and band limiting, in accordance with an embodiment of the present invention. This method is for use with a dynamically adjustable instrumentation amplifier including a pair of buffered operational amplifiers (e.g., OP1 and OP2 in FIG. 11B) that accept a pair of input signals V1 and V2, and a differential operational amplifier (e.g., OP3 in FIG. 11B) that outputs an output signal Vout indicative of a difference between the pair of input signals V1 and V2. Referring to FIG. 12, at step 1202 the bandwidth of a signal upstream of the instrumentation amplifier (e.g., the input signal) is monitored. Additionally, or alternatively, the signal quality of a signal downstream of the instrumentation amplifier (e.g., the output signal) is monitored. Monitor signals from either or both of these monitors are received at a controller, such as controller 1120 shown in FIGS. 11B and 11C. As indicated at step 1204, noise shaping is dynamically performed within each of the operational amplifiers (e.g., OP1, OP2 and OP3 in FIG. 11B) by a controller, such as controller 1120 in FIG. 11C, based on the monitor signal received from the bandwidth monitor and/or the signal quality monitor, which results in an increase in output voltage noise at frequencies greater than the crossover frequency but a reduction in overall power consumption. As was explained above, such noise shaping can be performed by appropriate ratioing of input transconductance stages (e.g., Gms and Gmf) within the multi-path amplifiers, and appropriate ratioing of capacitors (e.g., Ccs and Ccf) within the multi-path amplifiers. The values of the transconductance stages as well as the capacitors can be dynamically adjusted as described above, to effect the desired ratios. As indicated at step 1206, passive band limiting of the output signal Vout is dynamically adjusted (e.g., using the controller 1120 in FIG. 11B) to thereby filter out output voltage noise at frequencies greater than a cutoff frequency. For the reasons explain above, when such dynamic noise shaping and band limiting is performed, power consumption can be improved for a given signal quality or signal quality can be improved for a given power consumption.

As was explained above, the cutoff frequency in step 1206 and the output voltage noise at frequencies greater than the crossover frequency in step 1204 are adjusted dynamically by a controller based on a bandwidth monitor and/or a signal quality monitor in step 1202. In accordance with an embodiment, the cutoff frequency in step 1206 is equal to the crossover frequency in step 1204. In another embodiment, cutoff frequency in step 1206 is less than the crossover frequency in step 1204. In still another embodiment, the cutoff frequency in step 1206 is greater than the crossover frequency in step 1204.

Embodiments of the present invention have been described above with the aid of functional building blocks illustrating the performance of specified functions and relationships thereof The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art, and are within the scope of the present invention.

Embodiments were chosen and described in order to best describe the principles of the invention and its practical application, thereby enabling others skilled in the art to understand the invention. It is intended that the scope of the invention be defined by the following claims and their equivalents.

What is claimed:

1. A circuit, comprising:
   an instrumentation amplifier including a pair of buffered operational amplifiers that accept a pair of input signals, and a differential operational amplifier that outputs an output signal indicative of a difference between the pair of input signals;
   a dynamically adjustable low pass filter configured to provide band limiting of the output signal at frequencies greater than a cutoff frequency;
   at least one monitor configured to monitor a signal upstream of the instrumentation amplifier and/or a signal downstream of the instrumentation amplifier and output a monitor signal;
   wherein each of the buffered operational amplifiers and the differential operational amplifier are implemented as a multi-path amplifier that includes a low frequency path and a high frequency path between an input and an output of the operational amplifier;
   wherein each of the multi-path amplifiers includes a differential input transconductance stage within the low frequency path and a differential input transconductance stage within the high frequency path;
   wherein, within each of the multi-path amplifiers, the differential input transconductance stage of the high frequency path is configured to provide dynamically adjustable noise shaping by producing more noise but consuming less power than the differential input transconductance stage of the low frequency path above a crossover frequency; and
   a controller configured to receive at least one said monitor signal, wherein the controller is configured to dynamically adjust output voltage noise at frequencies greater than the crossover frequency of the multipath amplifiers and/or the cutoff frequency of the low pass filter based on at least one said monitor signal.

2. The circuit of claim 1, wherein the controller is configured to dynamically adjust the output voltage noise at frequencies greater than the crossover frequency of the multi-path amplifiers and/or the cutoff frequency of the low pass filter based on at least one said monitor signal to reduce power consumption of the instrumentation amplifier.

3. The circuit of claim 2, wherein noise shaping and band limiting are dynamically adjusted to improve signal quality of the signal downstream of the instrumentation amplifier for a given power consumption.

4. The circuit of claim 2, wherein noise shaping and band limiting are dynamically adjusted to improve power consumption of the instrumentation amplifier for a given signal quality of the signal downstream of the instrumentation amplifier.

5. The circuit of claim 2, wherein the controller dynamically adjusts the low pass filter and the multi-path amplifiers to set the cutoff frequency equal to the crossover frequency.

6. The circuit of claim 2, wherein the noise shaping provided by each multipath amplifier is dynamically adjusted by the controller by selectively adjusting a capacitance and a reference current in the differential input transconductance stage of the high frequency path of each multipath amplifier.

7. The circuit of claim 6, wherein the controller uses one of a lookup table and a search algorithm to determine which capacitance and reference current to select.

8. The circuit of claim 1, wherein the at least one monitor comprises a bandwidth monitor configured to monitor a bandwidth of the signal upstream of the instrumentation amplifier.

9. The circuit of claim 1, wherein the at least one monitor comprises a signal quality monitor configured to monitor signal quality of the signal downstream of the instrumentation amplifier.

10. The circuit of claim 1, wherein the at least one monitor comprises:
   a bandwidth monitor configured to monitor a bandwidth of the signal upstream of the instrumentation amplifier; and
   a signal quality monitor configured to monitor signal quality of the signal downstream of the instrumentation amplifier.

11. The circuit of claim 1, wherein the band limiting provided by the low pass filter is dynamically adjusted by the controller by selectively adjusting a capacitance within the low pass filter.

12. The circuit of claim 11, wherein the controller uses at least one of a lookup table and a search algorithm to determine which capacitance to select.

13. A method for use with a dynamically adjustable instrumentation amplifier including a pair of buffered operational amplifiers that accept a pair of input signals, and a differential operational amplifier that outputs an output signal indicative of a difference between the pair of input signals, the method comprising:
(a) monitoring a signal upstream of the dynamically adjustable instrumentation amplifier and/or a signal downstream of the dynamically adjustable instrumentation amplifier; and
(b) dynamically adjusting noise shaping within each of the operational amplifiers of the instrumentation amplifier based on the monitoring to thereby increase output voltage noise at frequencies greater than a crossover frequency, and/or dynamically adjusting passive band limiting of the output signal based on the monitoring to thereby filter out output voltage noise at frequencies greater than a cutoff frequency.

14. The method of claim 13, wherein step (b) comprises dynamically adjusting noise shaping and dynamically adjusting passive band limiting to improve signal quality of the signal downstream of the dynamically adjustable instrumentation amplifier for a given power consumption of the dynamically adjustable instrumentation amplifier.

15. The method of claim 13, wherein step (b) comprises dynamically adjusting noise shaping and dynamically adjusting passive band limiting to improve power consumption of the dynamically adjustable instrumentation amplifier for a given signal quality of the signal downstream of the dynamically adjustable instrumentation amplifier.

16. The method of claim 13, wherein the cutoff frequency is dynamically adjusted to be equal to the crossover frequency.

17. The method of claim 13, wherein the dynamically adjusting noise shaping of step (b) comprises selectively adjusting a capacitance and a reference current in each multipath amplifier.

18. The circuit of claim 13, wherein the dynamically adjusting passive band limiting of step (b) comprises selectively adjusting a capacitance within a low pass filter in the dynamically adjustable instrumentation amplifier.

19. A circuit, comprising:
a first operational amplifier configured as a buffer, and including an input that accepts a first input signal and including an output;
a second operational amplifier configured as a buffer, and including an input that accepts a second input signal and including an output;
a third operational amplifier configured as differential amplifier and including an inverting input, a non-inverting input, and an output;
a first resistor connecting the output of the first operational amplifier to the inverting input of the third operational amplifier;
a second resistor connecting the output of the second operational amplifier to the non-inverting input of the third operational amplifier;
a dynamically adjustable low pass filter configured to band limit an output signal, indicative of a difference between the pair of input signals, provided at the output of the third operational amplifier;
at least one monitor configured to monitor the first and second input signals and/or the output signal and output at least one monitor signal;
a controller configured to receive the at least one monitor signal and dynamically adjust the dynamically adjustable low pass filter based on the at least one monitor signal;
wherein each of the first, second and third operational amplifiers comprises a multi-path amplifier including a low frequency path and a high frequency path, with the low frequency path including an input transconductance stage (Gms) and the high frequency path including an input transconductance stage (Gmf), and with capacitors (Ccs and Ccf) that provide parallel integration paths for the low and high frequency paths;
wherein Gmf/Ccf=Gms/Ccs; and
wherein the controller is further configured to control noise shaping in each multi-path amplifier by dynamically adjusting Gmf and Ccf based on the monitor signal.

* * * * *